(12) United States Patent
Jeong et al.

(10) Patent No.: US 9,219,250 B2
(45) Date of Patent: Dec. 22, 2015

(54) OPTICAL FILM FOR REDUCING COLOR SHIFT AND ORGANIC LIGHT-EMITTING DISPLAY DEVICE EMPLOYING THE SAME

(71) Applicants: Samsung Electronics Co., Ltd., Suwon-si, Gyeonggi-do (KR); CHEIL INDUSTRIES INC., Gumi-si, Gyeongsangbuk-do (KR)

(72) Inventors: Chul-ho Jeong, Hwaseong-si (KR); Eun-young Cho, Gumi-si (KR); Hyun-min Kim, Uiwang-si (KR); You-min Shin, Gumi-si (KR); Hong-shik Shim, Seoul (KR); Young Oh, Uiwang-si (KR)

(73) Assignees: SAMSUNG ELECTRONICS CO., LTD. (KR); CHEIL INDUSTRIES INC. (KR)

( * ) Notice: Subject to any disclaimer, the term of this patent is extended or adjusted under 35 U.S.C. 154(b) by 0 days.

(21) Appl. No.: 14/295,594

(22) Filed: Jun. 4, 2014

(65) Prior Publication Data
US 2014/0353645 A1    Dec. 4, 2014

(30) Foreign Application Priority Data
Jun. 4, 2013  (KR) .................. 10-2013-0064339

(51) Int. Cl.
*H01L 51/52* (2006.01)
*H01L 27/32* (2006.01)
*G02B 5/02* (2006.01)

(52) U.S. Cl.
CPC .......... *H01L 51/5265* (2013.01); *G02B 5/0215* (2013.01); *G02B 5/0278* (2013.01); *H01L 27/3211* (2013.01); *H01L 51/5275* (2013.01); *H01L 51/5281* (2013.01); *Y10T 428/24612* (2015.01)

(58) Field of Classification Search
CPC . G02B 5/3041; G02B 6/0038; H01L 51/5262
See application file for complete search history.

(56) References Cited

U.S. PATENT DOCUMENTS

2003/0116270 A1* 6/2003 Hawa et al. ................. 156/307.1
2007/0153377 A1* 7/2007 Goto ............................. 359/460
2014/0203245 A1* 7/2014 Gupta et al. .................... 257/40

FOREIGN PATENT DOCUMENTS

KR   1020120081362 A   7/2012

\* cited by examiner

*Primary Examiner* — Thomas L Dickey
(74) *Attorney, Agent, or Firm* — Cantor Colburn LLP

(57) ABSTRACT

An optical film includes: a high refractive index pattern layer including a material having a refractive index greater than 1 and having a first surface and a second surface which face each other, where a plurality of grooves is defined in the first surface, and each of the plurality of grooves is defined by a curved surface portion of the first surface of the high refractive index pattern and has a depth greater than a width thereof; and a low refractive index pattern layer including a plurality of protruding patterns disposed in the plurality of grooves, having a refractive index less than the refractive index of the high refractive index pattern layer, and including a plurality of layers having different refractive indices from each other.

15 Claims, 14 Drawing Sheets

OPTICAL FILM FOR REDUCING COLOR SHIFT AND ORGANIC LIGHT-EMITTING DISPLAY DEVICE EMPLOYING THE SAME

RELATED APPLICATIONS

This application claims priority to Korean Patent Application No. 10-2013-0064339, filed on Jun. 4, 2013, and all the benefits accruing therefrom under 35 U.S.C. §119, the content of which in its entirety is herein incorporated by reference.

BACKGROUND

1. Field

The disclosure relates to an optical film for reducing a color shift and an organic light-emitting display device including the optical film.

2. Description of the Related Art

An organic light-emitting device ("OLED") typically includes an anode, an organic light-emitting layer, and a cathode. When a voltage is applied between the anode and the cathode, holes are injected from the anode into the organic light-emitting layer and electrons are injected from the cathode into the organic light-emitting layer. When the holes are injected from the anode into the organic light-emitting layer and the electrons are injected from the cathode into the organic light-emitting layer, the holes and the electrons injected into the organic light-emitting layer recombine in the organic light-emitting layer to generate excitons, and light is emitted when the excitons change from an excited state to a ground state.

In the OLED, a light-emitting material includes an organic material, such that the OLED may degrade and thus have a short lifespan. Accordingly, many technologies have been developed to prevent the degradation.

One of the technologies is a technology using a microcavity structure which involves resonating light of a specific wavelength to increase intensity of the light and emitting the light with the increased intensity. That is, the microcavity structure is a structure in which distances between an anode and a cathode are designed to representative wavelengths of red (R), green (G), and blue (B) light, and thus only a corresponding light is resonated and emitted to the outside and the intensity of lights of other wavelengths is relatively weakened. As a result, the intensity of the light beam emitted to the outside is increased and sharpened, thereby increasing luminance and color purity. Such an increase in the luminance leads to low current consumption and a long lifespan.

SUMMARY

In a micro cavity structure of an organic light-emitting device ("OLED"), wavelengths to be amplified are determined based on thickness of an organic deposition material layer. Here, length of a light path changes at a lateral side, thereby causing an effect similar to change of thickness of an organic deposition material layer. Therefore, wavelengths to be amplified are changed. In other words, as the viewing angle is tilted from the front to a side, the maximum resolution wavelength becomes shorter, and thus color shift occurs as the maximum resolution wavelength decreases. For example, even if white color is embodied at the front, the white color may become bluish at a lateral side due to blue shift phenomenon.

Provided are embodiments of an optical film for reducing a color shift and an organic light-emitting display device including the optical film.

Additional aspects and features will be set forth in part in the description which follows and, in part, will be apparent from the description, or may be learned by practice of the embodiments described herein.

According to an embodiment of the invention, an optical film includes: a high refractive index pattern layer including a material having a refractive index greater than 1 and having a first surface and a second surface, which face each other, where a plurality of grooves is defined in the first surface of the high refractive index pattern, and each of the plurality of grooves is defined by a curved surface portion of the first surface of the high refractive index pattern and has a depth greater than a width thereof; and a low refractive index pattern layer including a plurality of protruding patterns disposed in the plurality of grooves of the high refractive index pattern, having a refractive index less than the refractive index of the high refractive index pattern layer, and including a plurality of layers having different refractive indices from each other.

In an embodiment, the low refractive index pattern layer may include a first layer disposed on bottom surfaces of the plurality of grooves and has a thickness less than the depth of each of the plurality of grooves, and a second layer disposed on the first layer and including a material having a refractive index less than a refractive index of the first layer.

In an embodiment, the low refractive index pattern layer may further include an intermediate layer disposed between the first layer and the second layer and including a material having a refractive index less than the refractive index of the first layer and greater than the refractive index of the second layer.

In an embodiment, the first layer and a portion of the second layer may collectively define the plurality of protruding patterns which corresponds to the plurality of grooves, respectively.

In an embodiment, the second layer may further include a flat portion having a predetermined thickness and which connects the plurality of protruding patterns.

In an embodiment, the low refractive index pattern layer may include a resin material.

In an embodiment, the low refractive index pattern layer may include a transparent resin material including a light diffuser or a light absorber.

In an embodiment, each of the plurality of grooves may have a stripe shape.

In an embodiment, each of the plurality of grooves may have a dot shape.

In an embodiment, the optical film may further include an anti-reflection film disposed over the high refractive index pattern layer.

In an embodiment, the optical film may further include a circular polarization film disposed between the high refractive index pattern layer and the anti-reflection film, where the circular polarization film includes a phase shift layer and a linear polarization layer.

In an embodiment, the optical film may further include a transmittance-adjusting layer disposed between the high refractive index pattern layer and the anti-reflection film.

According to another embodiment of the invention, a method of manufacturing an optical film includes: providing a high refractive index pattern layer in which a plurality of grooves is defined, where each of the plurality of grooves has a depth greater than a width thereof; providing a first layer in the plurality of grooves of the high refractive index pattern layer using a material having a refractive index less than a refractive index of the high refractive index pattern layer, where the first layer has a thickness less than the depth of each of the plurality of grooves; and providing a second layer on the first layer using a material having a refractive index less than the refractive index of the first layer.

In an embodiment, the providing the first layer may include: preparing a mixed solution by mixing a photo-curable resin with a solvent; pouring the mixed solution in each of the plurality of grooves; and volatilizing the solvent in the mixed solution.

In an embodiment, a mixture ratio of the photo-curable resin and the solvent may be adjusted to adjust the thickness of the first layer.

In an embodiment, the mixture ratio of the photo-curable resin and the solvent may range from about 20:80 to about 80:20.

In an embodiment, the providing the second layer may include: preparing a mixed solution by mixing a photo-curable resin with a solvent; pouring the mixed solution in each of the plurality of grooves in which the first layer is provided; and volatilizing the solvent in the mixed solution.

According to another embodiment of the invention, an organic light-emitting display device includes: an organic light-emitting panel including a plurality of pixels and having a microcavity structure which resonates light having a corresponding wavelength, where the plurality of pixels comprises a plurality of organic light-emitting layers, each of which emits light of different wavelengths; and an optical film disposed on the organic light-emitting panel, where optical film includes: a high refractive index pattern layer comprising a material having a refractive index greater than 1 and having a first surface and a second surface, which face each other, where a plurality of grooves is defined in the first surface of the high refractive index pattern, and each of the plurality of grooves is defined by a curved surface portion of the first surface of the high refractive index pattern and has a depth greater than a width thereof; and a low refractive index pattern layer comprising a plurality of protruding patterns disposed in the plurality of grooves of the high refractive index pattern, having a refractive index less than the refractive index of the high refractive index pattern layer, and comprising a plurality of layers having different refractive indices from each other.

In an embodiment, each of the plurality of grooves may have a stripe shape.

In an embodiment, the plurality of pixels may be two-dimensionally arranged in vertical and horizontal directions on the organic light-emitting panel, where an extending direction of the stripe shape forms an angle greater than zero with the vertical direction of the plurality of pixels.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
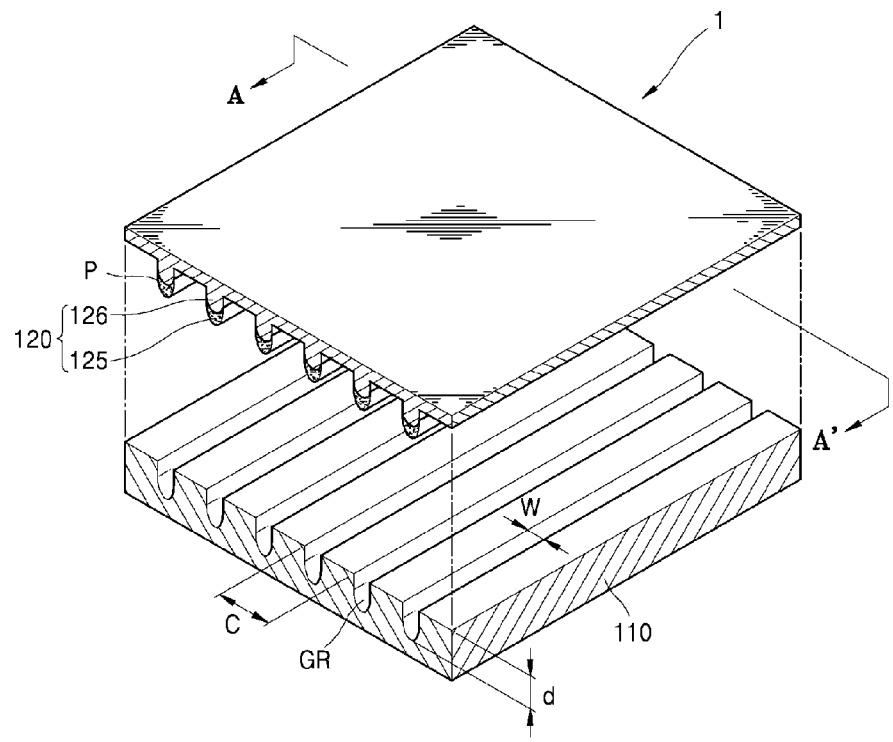
FIG. 1 is an exploded perspective view illustrating a structure of an embodiment of an optical film according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is an exploded perspective view illustrating a structure of an embodiment of an optical film 1 according to the invention.

An embodiment of the optical film 1 includes a high refractive index pattern layer 110 including a pattern in which a plurality of grooves GR that are curved are engraved, and a low refractive index pattern layer 120 including a plurality of layers having different refractive indices, which are less than a refractive index of the high refractive index pattern layer 110.

The high refractive index pattern layer 110 may include or be formed of a material having a refractive index that is equal to or greater than about 1, for example, a transparent plastic material. In an embodiment, the high refractive index pattern layer 110 may include or be formed of a transparent plastic material including a light diffuser or a light absorber. In such an embodiment, the light diffuser may be diffusing beads, and the light absorber may be a black dye such as carbon black. The light diffuser functions to planarize a peak that may occur in a color shift (Δu'v') and a luminance profile with respect to viewing angle, and thus to improve visual characteristics. In such an embodiment, the light absorber functions to increase a contrast ratio or a color purity by using a dye that selectively absorbs a specific wavelength or carbon black that may absorb substantially or nearly all wavelengths of visible light.

The grooves GR may have an aspect ratio greater than 1, that is, a depth d of the grooves GR may be greater than a width w of the grooves GR, and may be repeatedly arranged in predetermined cycles C.

A surface of each of the grooves GR may be a curved surface and may be aspheric surface. In one embodiment, for example, groove GR may have any of various aspheric surfaces such as an elliptical surface, a parabolic surface, or a hyperbolic surface. In an embodiment, each of the grooves GR may extend in a stripe shape as shown in FIG. 1.

The low refractive index pattern layer 120 includes a first layer 125 disposed on bottom surfaces of the grooves GR to have a thickness that is less than a depth d of each of the grooves GR, and a second layer 126 disposed on the first layer 125 and including a material having a refractive index that is less than a refractive index of the first layer 125.

The second layer 126 may include a plurality of protruding patterns P that respectively correspond to the plurality of grooves GR along with the first layer 125, and the second layer 126 may further include a flat portion having a predetermined thickness that connects the plurality of protruding patterns P, as shown in FIG. 1. In an embodiment, the second layer 126 fills a portion of each of the grooves GR remaining after the first layer 125 fills each of the grooves GR, and includes a flat portion having a predetermined thickness or greater. In an e embodiment, a thickness and the degree of flatness of the flat portion may vary with respect to a filling method or a filling material that fills each of the grooves GR.

In an embodiment, the low refractive index pattern layer 120 may include a resin material having a refractive index that is less than a refractive index of the high refractive index pattern layer 110. The low refractive index pattern layer 120 may include or be formed of a transparent plastic material including a light diffuser or a light absorber. The light diffuser may be diffusing beads, and the light absorber may be a black dye such as carbon black.

The low refractive index pattern layer 120 includes a plurality of layers having different refractive indices to increase adhesiveness with the high refractive index pattern layer 110. A refractive index difference between the low refractive index pattern layer 120 and the high refractive index pattern layer 110 is a factor for reducing a color shift, and thus the low refractive index pattern layer 120 and the high refractive index pattern layer 110 may be provided to have a gradual refractive index difference, thereby reducing a surface energy difference at a boundary surface and improving reliability.

In one embodiment, for example, the low refractive index pattern layer 120 includes two layers, that is, the first layer 125 and the second layer 126 as shown in FIG. 1, the invention is not limited thereto. In an alternative embodiment, the low refractive index pattern layer 120 may include three or more layers. A function of the optical film 1 to reduce a color shift will now be described, and arrangements of refractive indices of the low refractive index pattern layer 120 and optical effects thereof will be described later in greater detail.

The optical film 1 that refracts and emits light, which is incident in one direction, that is a single direction, in various directions with respect to incident positions functions to mix light, which will hereinafter be described in detail with reference to FIGS. 2 and 3.

Figure 2:
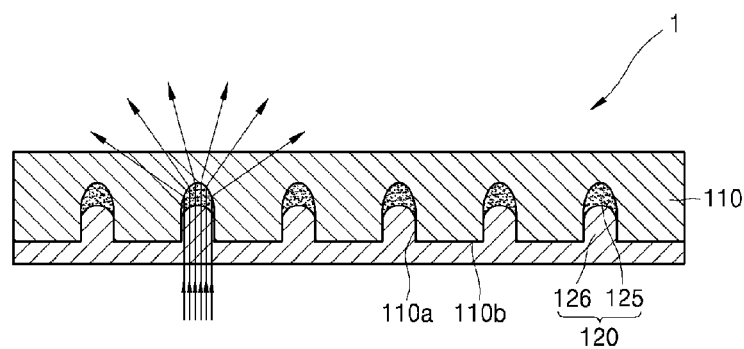
FIG. 2 is a cross-sectional view taken along line A-A' of FIG. 1, illustrating an optical path through which light vertically incident on the optical film of FIG. 1 is emitted

FIG. 2 is a cross-sectional view taken along line A-A' of FIG. 1, illustrating an optical path through which light vertically incident on the optical film 1 is emitted. FIG. 3 is a cross-sectional view taken along line A-A' of FIG. 1, illustrating an optical path through which light obliquely incident on the optical film 1 is emitted.

Figure 3:
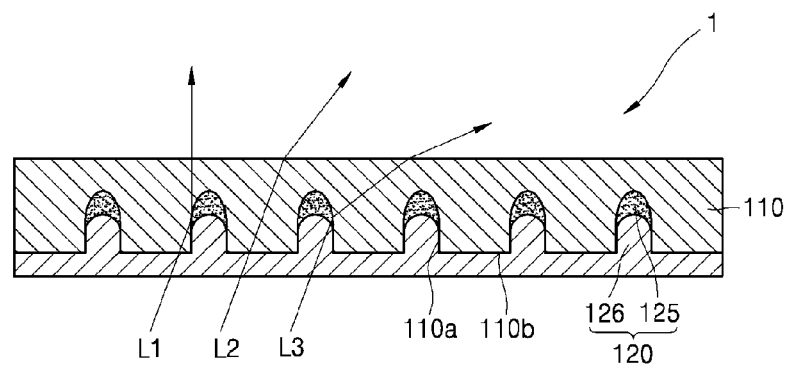
FIG. 3 is a cross-sectional view taken along line A-A' of FIG. 1, illustrating an optical path through which light obliquely incident on the optical film is emitted.

Referring to FIGS. 2 and 3, a boundary surface between the high refractive index pattern layer 110 and the low refractive index pattern layer 120 includes a curved surface 110*a*, which defines the groove GR, and a flat surface 110*b*, and the curved surface 110*a* functions as a lens surface.

Referring to FIG. 2, light vertically incident on the optical film 1 is refracted and emitted from the optical film 1 in various directions with respect to positions at which the light meets the curved surface 110*a*. That is, light beams incident to the optical film 1 with the same incident angle are refracted in various directions with respect to positions at which the light meets the curved surface 110*a*, thereby the optical film 1 diffuses light.

Referring to FIG. 3, light obliquely incident on the optical film 1 is refracted in various directions with respect to positions at which the light is incident. In an embodiment, light L1 that passes through the flat surface 110*b* and meets the curved surface 110*a* in the high refractive index pattern layer 110 is totally reflected by the curved surface 110*a* and is emitted from the optical film 1. In such a path, an angle at which the light L1 is emitted from a top surface of the high refractive index pattern layer 110 is less than an angle at which the light L1 is incident on the optical film 1. Light L2 that passes through the flat surface 110*b* without passing through the curved surface 110*a* is refracted at a boundary between the high refractive index pattern layer 110 and the outside, with a refraction angle that is greater than an incident angle. That is, the light L2 is emitted from the optical film 1 at an angle that is greater than the incident angle at which the light L2 is incident on the optical film 1. Also, since light L3 that meets the curved surface 110*a* in the low refractive index pattern layer 120 is refracted by the curved surface 110*a* and then is refracted again by the top surface of the high refractive index pattern layer 110, the light L3 is emitted from the optical film 1 at a refraction angle that is greater than that of the light L2 that is emitted after passing through the flat surface 110*b* without meeting the curved surface 110*a*. As such, the lights L1, L2 and L3 that are obliquely incident on the optical film 1 at the same angle are emitted from the optical film 1 at different refraction angles with respect to positions on the optical film 1 at which the lights L1, L2, and L3 are incident.

As described above, during light beams are passing through the optical film 1, light beams incident on the optical film 1 at various angles are mixed together.

In FIGS. 2 and 3, a specific optical path through which incident light is diffused is exemplary, and is also exaggerated for convenience of illustration. For example, refraction of light that may occur at a flat surface 110*b* is not shown. Also, an optical path is slightly changed based on a refractive index difference between the high refractive index pattern layer 110 and the low refractive index pattern layer 120, an aspect ratio of each of the grooves GR in the high refractive index pattern layer 110, a cycle C or a pitch in which the grooves GR are repeatedly arranged, a width w of each of the grooves GR, and a shape of a curved surface of the groove GR, such that an extent to which light is mixed and a luminance of emitted light are also changed based thereon.

According to the afore-described light mixing effect, when light beams incident on the optical film 1 have different optical characteristics with respect to the incident angles of the light beams, the light beams are emitted after the optical characteristics are uniformly combined. In one embodiment, for example, when light is emitted from an OLED, a color shift, which is a phenomenon where color characteristics slightly vary with respect to an angle at which the light is emitted, may occur. However, in an embodiment described above, light of different color shift are mixed after the light passes through the optical film 1 having the above-described structure, such that the degree of color shift with respect to viewing angles is substantially reduced.

Figure 4:
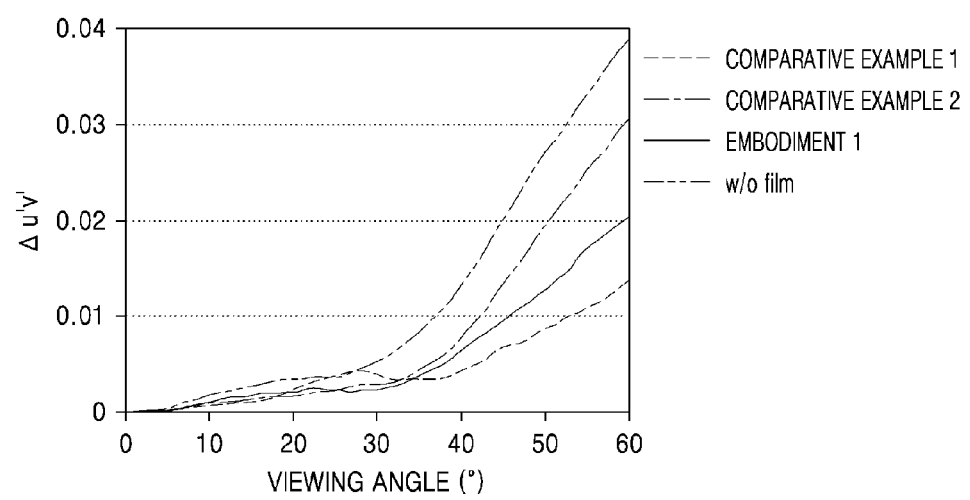
FIG. 4 is a computer simulation graph illustrating a relationship between a color shift and a viewing angle in an embodiment of an optical film according to the invention and comparative embodiments of an optical film.
Figure 5:
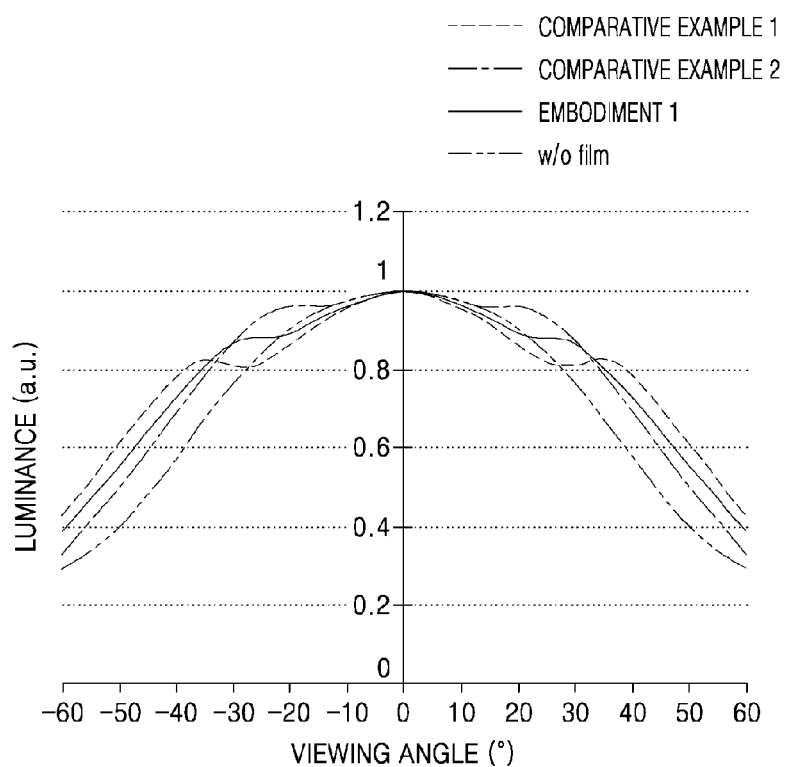
FIG. 5 is a computer simulation graph illustrating a relationship between a luminance and a viewing angle in an embodiment of the optical film according to the invention and comparative embodiments of an the optical film.

FIG. 4 is a computer simulation graph illustrating a relationship between a color shift and a viewing angle in an embodiment of an optical film of the invention (an embodiment 1) and comparative embodiments of an optical film (comparative examples 1 and 2). FIG. 5 is a computer simulation graph illustrating a relationship between a luminance and a viewing angle in an embodiment of the optical film (the embodiment 1) and the comparative embodiments of the optical film (the comparative examples 1 and 2).

Computer simulation was performed by using a lighting optical simulation program, and a relationship between a color shift ($\Delta u'v'$) and a viewing angle was calculated based on a front white (x, y)=(0.28, 0.29) color in an OLED panel having a microcavity structure.

In the graphs, in the comparative examples 1 and 2, a low refractive index pattern layer is formed of a material having one refractive index, instead of including a plurality of layers. The comparative example 1 is a case where a high refractive index pattern layer has a refractive index of 1.57 and a low refractive index pattern layer has a refractive index of 1.41. The comparative example 2 is a case where a high refractive index pattern layer has a refractive index of 1.57 and a low refractive index pattern layer has a refractive index of 1.47. The embodiment 1 is a case where a high refractive index pattern layer, a first layer, and a second layer respectively have refractive indices of 1.57, 1.53 and 1.41. Also, a color shift and a luminance in a case where no optical film is provided are also shown in each of the graphs.

Referring to the graphs of FIGS. 4 and 5, in the comparative example 1, the amount of improvement in a color shift is substantially great, but the amount of luminance reversal is greater than in other cases. Also, in the comparative example 2, the amount of luminance reversal is less than that in the comparative example 1, but the amount of improvement in a color shift is less. The term "luminance reversal" used herein refers to a phenomenon where as a viewing angle increases, luminance is instantly increased at a specific angle (instead of being gradually decreased) and then is reduced.

In the embodiment 1, a color shift is greater than that in the comparative example 1, but is less than that in the comparative example 2. in the embodiment 1, a color shift at a lateral side compared to a front is less than about 0.02, such that the color shift may not easily perceived by a user, and a color shift in the embodiment 1 is thereby effectively improved. Also, in the embodiment 1, the amount of luminance reversal is less than those in the comparative examples 1 and 2.

Table 1 shows a color shift improvement rate and a front transmittance in various embodiments (e.g., embodiment 1 to embodiment 5) where refractive indices of a first layer and a second layer constituting low refractive index pattern layers are changed.

TABLE 1

| | Color shift (Δu'v') | Front transmittance [%] |
|---|---|---|
| Embodiment 1 (1.57/1.53/1.41) | 0.0230 | 90.1 |
| Embodiment 2 (1.57/1.51/1.41) | 0.0217 | 89.7 |
| Embodiment 3 (1.57/1.49/1.41) | 0.0192 | 89.1 |
| Embodiment 4 (1.57/1.47/1.41) | 0.0184 | 88.5 |
| Embodiment 5 (1.57/1.45/1.41) | 0.0160 | 88.1 |
| Comparative example 1 (1.57/1.41) | 0.0136 | 88.4 |
| Comparative example 2 (1.57/1.47) | 0.0306 | 91.9 |

In Table 1, in the embodiments 1 through 5, a refractive index of a high refractive index pattern layer, a refractive index of a first layer, and a refractive index of a second layer are sequentially shown, and in the comparative examples 1 and 2 where a low refractive index pattern layer has one refractive index, a refractive index of a high refractive index pattern layer and a refractive index of a low refractive index pattern layer are shown.

A color shift is a value obtained by calculating a change at a viewing angle of 60° with respect to a front white (x, y)=(0.28, 0.29) color.

In the comparative examples 1 and 2, a color shift with respect to a refractive index of a low refractive index pattern layer greatly varies, which may increase a sensitivity of a process of forming the low refractive index pattern layer.

In an embodiment, e.g., the embodiments 1 through 5, a color shift decreases as a refractive index difference between a high refractive index pattern layer and a first layer increases. In such an embodiment, a variation in the color shift with respect to the viewing angle is less than that in the comparative examples 1 and 2, and a color shift is thereby effectively reduced. Also, although a front transmittance gradually decreases as a refractive index difference between a high refractive index pattern layer and a first layer increases as shown in Table 1, the front surface transmittance in such embodiments is substantially high.

Figure 6:
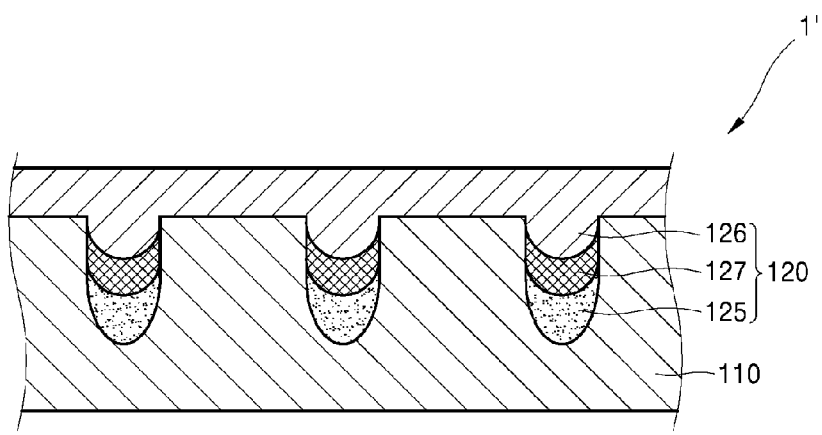
FIG. 6 is a cross-sectional view illustrating a structure of an another embodiment of an optical film according to the invention.

FIG. 6 is a cross-sectional view illustrating a structure of an alternative embodiment of an optical film 1' according to the invention.

Referring to FIG. 6, in an embodiment, the low refractive index pattern layer 120 of the optical film 1' includes three layers. In such an embodiment, the optical film 1' further includes an intermediate layer 127 that is disposed between the first layer 125 and the second layer 126, and the intermediate layer 127 may include or be formed of a material having a refractive index that is less than a refractive index of the first layer 125 and greater than a refractive index of the second layer 126.

In an embodiment, the intermediate layer 127 may be have a single layer structure as shown in FIG. 6, the invention is not limited thereto. In an alternative embodiment, the intermediate layer 127 may have a multi-layer structure including a plurality of layers having refractive indices that gradually decrease as being away from the first layer 125 toward the second layer 126.

Hereinafter, exemplary embodiments where a low refractive index pattern layer includes two layers will be described in detail, but the invention is not limited thereto. As described above, in an alternative embodiment, the low refractive index pattern layer may include three or more layers as shown in FIG. 6.

Figure 7:
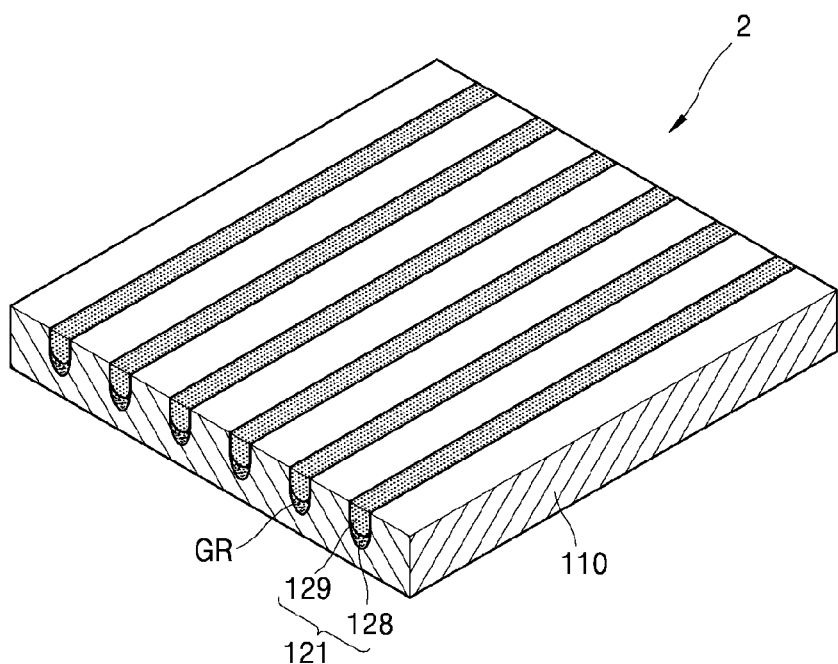
FIG. 7 is an exploded perspective view illustrating a structure of another embodiment of an optical film according to the invention.

FIG. 7 is an exploded perspective view illustrating a structure of another embodiment of an optical film 2 according to the invention.

In an embodiment, as shown in FIG. 7, the optical film 2 includes the high refractive index pattern layer 110 formed of a material having a refractive index that is greater than 1 and having a pattern in which the plurality of grooves GR that are curved and each have a depth that is greater than a width are engraved, and a low refractive index pattern layer 121 including a material having a refractive index less than the refractive index of the high refractive index pattern layer 110. The low refractive index pattern layer 121 includes a first layer 128 and a second layer 129 having a refractive index that is less than a refractive index of the first layer 128.

The optical film 2 of FIG. 7 is substantially the same as the optical film shown in FIGS. 1 to 3, except for a shape of the low refractive index pattern layer 121, specifically, a shape of the second layer 129. In an embodiment, as shown in FIG. 7, the second layer 129 has a shape that fills a remaining portion of each of the grooves GR after the first layer 128 fills a portion of each of the grooves GR, and does not include a flat portion. In such an embodiment, the second layer 129 may be formed of a resin material or may be defined by an empty space in which air is filled.

Figure 8:
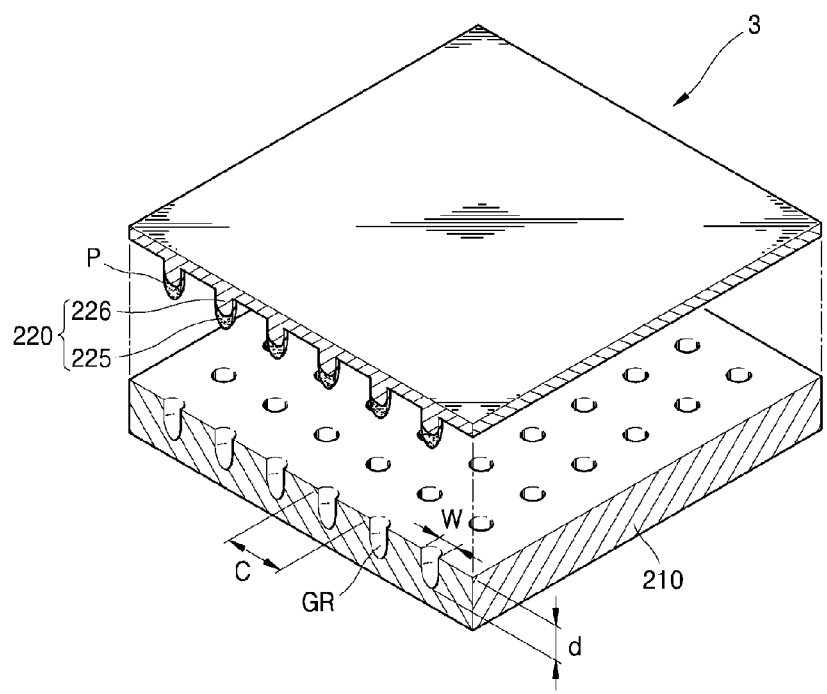
FIG. 8 is an exploded perspective view illustrating a structure of another embodiment of an optical film according to the invention.

FIG. 8 is an exploded perspective view illustrating a structure of another embodiment of an optical film 3 according to the invention.

The optical film 3 includes a high refractive index pattern layer 210 having a pattern in which the plurality of grooves GR that are curved are engraved, and a low refractive index pattern layer 220 that is disposed on the high refractive index pattern layer 210, includes a material having a refractive index that is less than a refractive index of the high refractive index pattern layer 210, and has a plurality of protruding patterns P that respectively correspond to the plurality of grooves GR. The low refractive index pattern layer 220 includes a first layer 225, and a second layer 226 having a refractive index that is less than that of the first layer 225.

The optical film 3 of FIG. 8 is substantially the same as the optical film 1 of FIG. 1 the optical film shown in FIGS. 1 to 3, except that each of the grooves GR has a dot shape.

Figure 9:
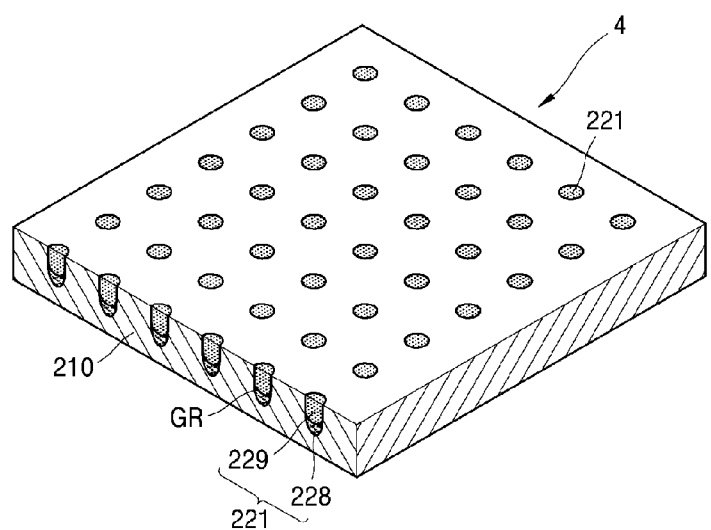
FIG. 9 is a cross-sectional view illustrating a structure of another embodiment of an optical film according to the invention.

FIG. 9 is a perspective view illustrating a structure of another embodiment of an optical film 4 according to the invention.

The optical film 4 of FIG. 9 is substantially the same as the optical film 3 of FIG. 8 except for a shape of a low refractive index pattern layer 221. That is, a second layer 229 has a shape that fills a remaining portion of each of the grooves GR having a dot shape remaining after a first layer 228 fills a portion of each of the grooves GR, and does not include a flat portion. In such an embodiment, the second layer 129 may include a resin material or may be defined by an empty space in which air is filled.

FIGS. 10A through 10D are cross-sectional views showing an embodiment of a method of manufacturing an optical film, according to the invention.

Figure 10A:
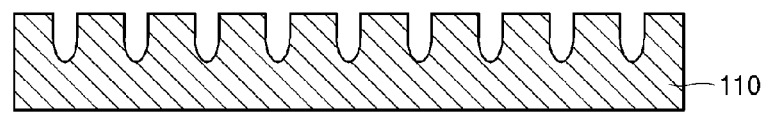
FIGS. 10A through 10D are cross-sectional views showing an embodiment of a method of manufacturing an optical film, according to the invention.

First, referring to FIG. 10A, the high refractive index pattern layer 110 is provided, e.g., formed. In such an embodiment, the high refractive index pattern layer 110 has a shape in which the grooves GR having a depth that is greater than a width are engraved.

The high refractive index pattern layer 110 may be formed of a material having a refractive index greater than about 1, for example, a photo-curable resin having a refractive index of about 1.52 or more to provide an optical effect. In one embodiment, for example, a mold having patterns corresponding to the grooves GR may be formed, and then imprinting using the mold may be performed such that the high refractive index pattern layer 110 having a shape illustrate in FIG. 10A may be provided. Such a mold may be formed by using, for example, a diamond bite having a predetermined shape and performing precision machining on a surface of a circular plate plated with copper or nickel. The mold may be directly used, or a soft mold formed of a polymer material may be manufactured and used as a mold to form the high refractive index pattern layer 110 having the shape illustrated in FIG. 10A.

In an embodiment, a substrate (not shown) may be provided or disposed under the high refractive index pattern layer 110. In such an embodiment, a photo-curable resin to be pattern-transferred may be applied to the high refractive index pattern layer 110, and then a mold may be imprinted to the photo-curable resin. During the imprinting, ultraviolet ("UV") exposure may also be performed. A material of the substrate may be an optically isotropic material, for example, cyclo-olefin polymer ("COP"), a trialkyl cellulose ("TAC") film, a polyester-based material, a polycarbonate-based material, or a polysulfone-based material.

Figure 10B:
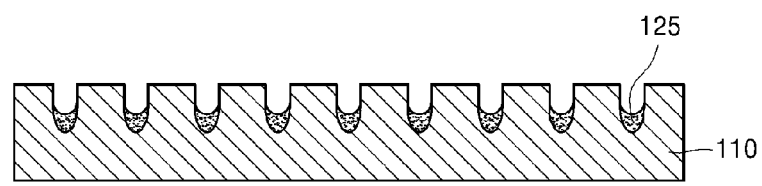

Next, referring to FIG. 10B, the first layer 125 having a thickness that is less than a depth of each of the grooves GR is provided or formed using a material having a refractive index that is less than a refractive index of the high refractive index pattern layer 110.

In such an embodiment, to provide the first layer 125, a mixed solution obtained by mixing a photo-curable resin with a solvent may be prepared, the mixed solution may be poured in each of the plurality of grooves GR, and the solvent may be volatilized.

In this case, the photo-curable resin may have a refractive index that is less than a refractive index of the photo-curable resin used to form the high refractive index pattern layer 110. In one embodiment, for example, the photo-curable resin may have an acid value ranging from about 5 mgKOH/g to about 40 mgKOH/g, and the solvent may be an about 2.38% tetramethylammonium hydroxide ("TMAH") aqueous solution or a potassium hydroxide ("KOH") aqueous solution. In such an embodiment, when an acid value of a resin is low and thus dissolution is difficult, an organic solvent having a solubility parameter ranging from about 25 dye per centimeter (dyne/cm) to about 45 dyne/cm may be selected and used.

A thickness of the first layer 125 may be adjusted based on a mixture ratio of the photo-curable resin and the solvent. A ratio of the resin to the solvent may range from about 20:80 to about 80:20 in consideration of process facility and volatile characteristics of the solvent.

In such an embodiment, a typical method such as gravure coating, reverse roll coating, knife roll coating, or slot die coating may be used to fill the mixed solution of the resin and the solvent in each of the grooves GR.

When the solvent is dried, thermal drying and/or UV exposure may be performed. A thickness of the first layer 125 may be adjusted to range from about 20% to about 80% of a depth of each of the grooves GR during the thermal drying and/or the UV exposure.

Figure 10C:
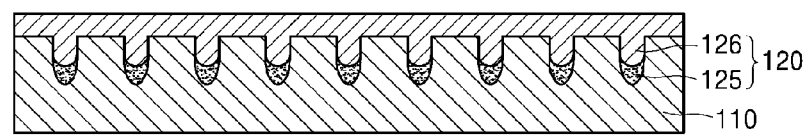

Next, referring to FIG. 10C, the second layer 126 is provided or formed on the first layer 125 by using a material having a refractive index that is less than a refractive index of the first layer 125. In such an embodiment, a process similar to a process of forming the first layer 125 is performed. A photo-curable resin having a refractive index that is less than a refractive index of the first layer 125 may be used, and a mixture ratio of the photo-curable resin and the solvent may be appropriately adjusted to allow the second layer 126 to have a predetermined thickness.

Figure 10D:
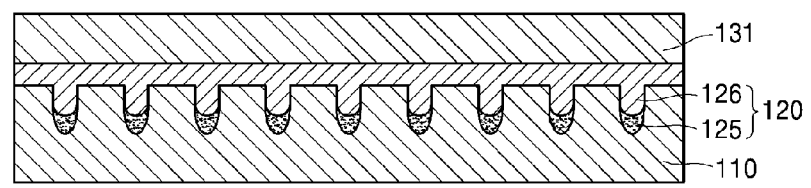

Next, referring to FIG. 10D, an adhesive layer 131 may be further provided or formed on the second layer 120. The adhesive layer 131 may be a layer for attaching the manufactured optical film to a predetermined position, for example, to a display panel.

In an embodiment, a process of further providing films (not shown) for performing various functions, for example, a circular polarization film or an anti-reflection film on a bottom surface of the high refractive index pattern layer 110 may be performed.

In an embodiment of the optical film, e.g., the optical films 1 through 4 shown in FIGS. 1 to 9, may further include an adhesive layer, an anti-reflection film, a circular polarization film, or a transmittance-adjusting layer, which is typically included in an optical film that is applied to an organic light-emitting display device, and structures of various embodiments of an optical film including such an additional layer or film will now be described in detail.

Figure 11:
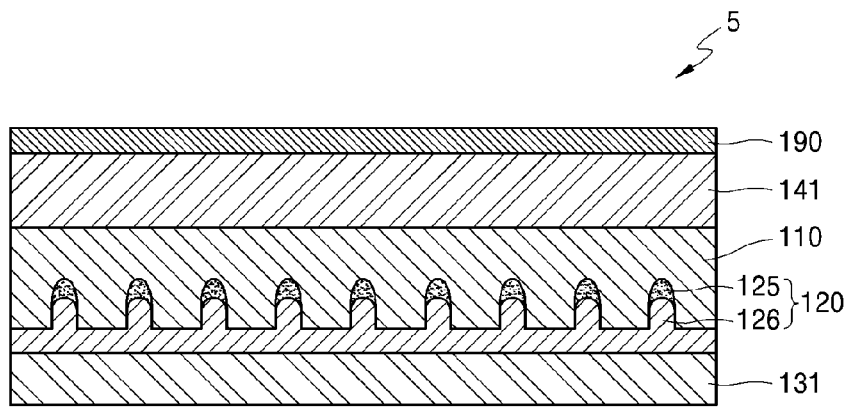
FIG. 11 is a cross-sectional view illustrating a structure of another embodiment of an optical film according to the invention.

FIG. 11 is a cross-sectional view illustrating a structure of another embodiment of an optical film 5 according to the invention.

In an embodiment of the optical film 5, an anti-reflection film 190 may be further disposed over the high refractive index pattern layer 110, the adhesive layer 131 (hereinafter, referred to as a first adhesive layer) may be further disposed under the low refractive index pattern layer 120, and a first base film 141 may be further disposed between the high refractive index pattern layer 110 and the anti-reflection film 190.

The anti-reflection film 190 may have a multi-layer stacked structure including inorganic materials having different refractive indices, for example, a two-layer structure including a high refractive index pattern layer and a low refractive index pattern layer.

The first adhesive layer 131 that is provided in order to adhere to an organic light-emitting panel may include a pressure sensitive adhesive ("PSA") material. The first adhesive layer 131 may include a PSA material including a light absorber or a light diffuser. In such an embodiment, the high refractive index pattern layer 110 and/or the low refractive index pattern layer 120 may include a transparent material including a light absorber. When a material including a light absorber is applied to various layers constituting the optical film 5, a reflectance of external light may be reduced and visibility may be improved.

The first base film 141 that is used to form the high refractive index pattern layer 110 and the low refractive index pattern layer 120 may include an optically isotropic material, for example, TAO.

FIGS. 12 through 18 are cross-sectional views illustrating structures of embodiments of an optical film 6 through 12, each including a circular polarization film, according to the invention.

In an embodiment, the optical film may include the circular polarization film including a phase shift layer 150 and a linear polarization layer 160.

The phase shift layer 150 may be, for example, a λ/4 phase difference film.

The linear polarization layer 160 may include a polyvinyl alcohol ("PVA") film or may have a TAO film-stacked structure or any of various other structures. The PVA film that functions to polarize light may be formed by adsorbing a dichroic pigment onto PVA that is a polymer.

Figure 12:
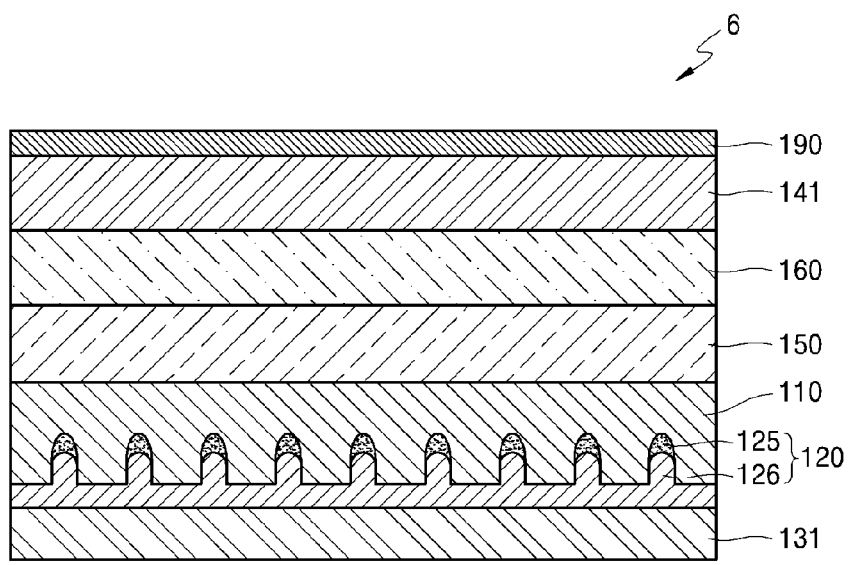
FIGS. 12 through 18 are cross-sectional views illustrating structures of embodiments of an optical film, each including a circular polarization film, according to the invention.
Figure 13:
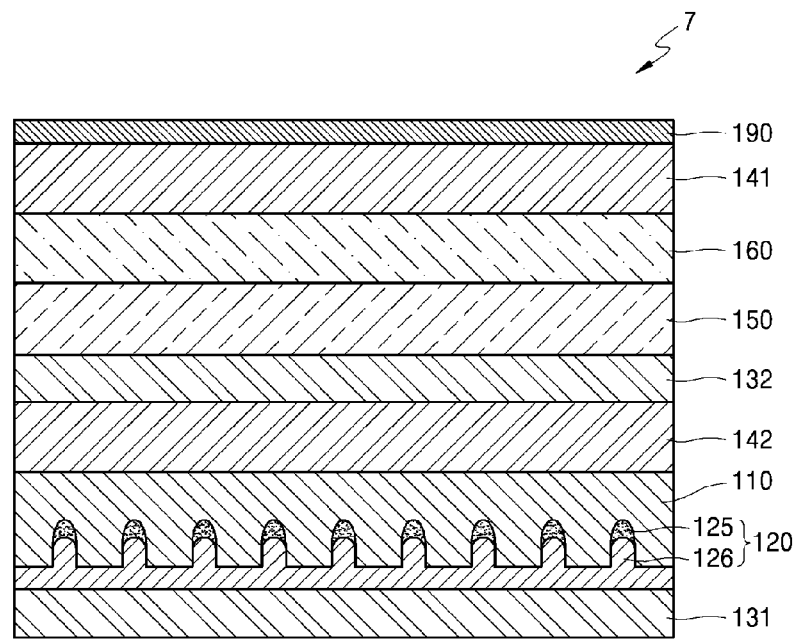

Referring to FIGS. 12 and 13, an embodiment of the optical film 6 or 7 includes the adhesive layer 131, the low refractive index pattern layer 120, the high refractive index pattern layer 110, the phase shift layer 150, the linear polarization layer 160, the first base film 141, and the anti-reflection film 190 that are sequentially disposed from the bottom, e.g., sequentially stacked on one another.

The circular polarization film, including the phase shift layer 150 and the linear polarization layer 160, functions to reduce a reflectance of external light and improve visibility. When external light that is non-polarized is incident to the circular polarization film, the external light is changed to linearly polarized light by passing through the linear polarization layer 160, and is changed to circularly polarized light by passing through the phase shift layer 150. The circularly polarized light passes through an interfacial surface between the phase shift layer 150 and the high refractive index pattern layer 110, the high refractive index pattern layer 110, the low refractive index pattern layer 120 and the first adhesive layer 131, and is reflected by an interfacial surface between an organic light-emitting panel (not shown) and the first adhesive layer 131, such that the circularly polarization direction of the reflected circularly polarized light is changed oppositely. Then, the circularly polarized light is changed to linearly polarized light that is perpendicular to a transmission axis of the linear polarization layer 160 by passing through the phase shift layer 150, thereby effectively prevented from being emitted toward the outside.

As shown in FIGS. 12 and 13, in an embodiment where the circular polarization film is disposed on the high refractive index pattern layer 110, if the high refractive index pattern layer 110 is formed of an anisotropic material whose optical axis is different from the circular polarization film, polarization may not be maintained, incident external light may be emitted to the outside again, a reflectance may be drastically increased, and thus visibility may be reduced. Accordingly, in such an embodiment, the high refractive index pattern layer 110 is formed of an isotropic material whose optical axis is substantially the same as that of the circular polarization film, such as TAO or solvent-cast polycarbonate ("PC").

The optical film 7 of FIG. 13 is substantially the same as the optical film 6 of FIG. 12 except for a second base film 142 and a second adhesive layer 132, which are disposed between the high refractive index pattern layer 110 and the phase shift layer 150 to be sequentially disposed from the high refractive index pattern layer 110 toward the phase shift layer 150.

Figure 14:
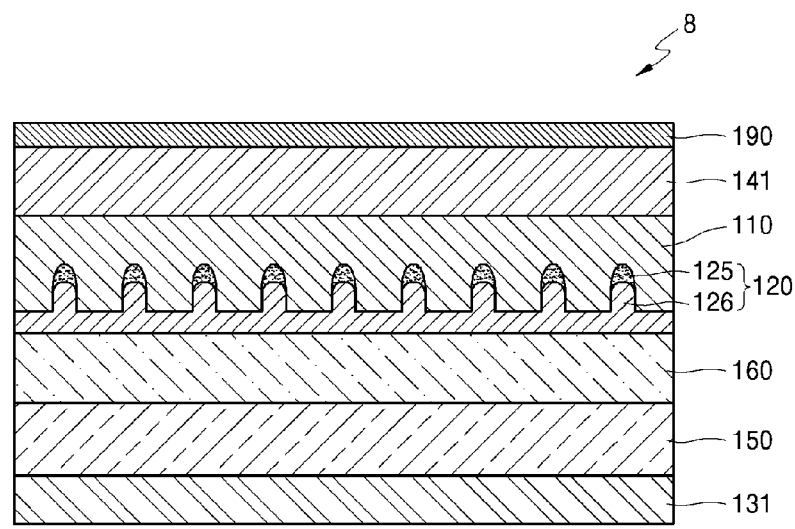
Figure 15:
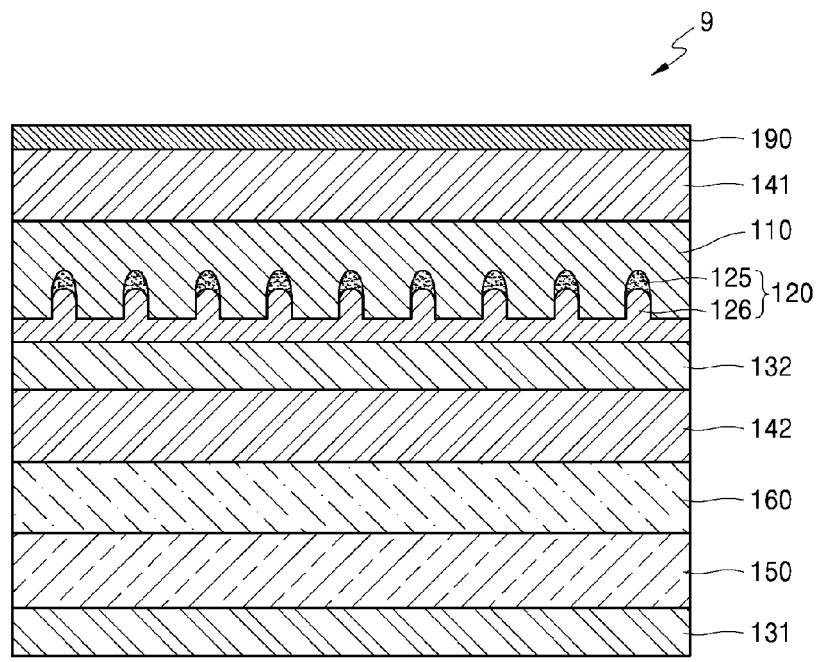

Referring to FIGS. 14 and 15, an alternative embodiment of the optical film 8 or 9 may include the first adhesive layer 131, the phase shift layer 150, the linear polarization layer 160, the low refractive index pattern layer 120, the high refractive index pattern layer 110, the first base film 141 and the anti-reflection film 190.

In such an embodiment, as shown in FIG. 15, the optical film 9 may further include the second base film 142 and the second adhesive layer 132, which are disposed between the linear polarization layer 160 and the low refractive index pattern layer 120 to be sequentially disposed from the low refractive index pattern layer 120 toward the linear polarization layer 160.

Figure 16:
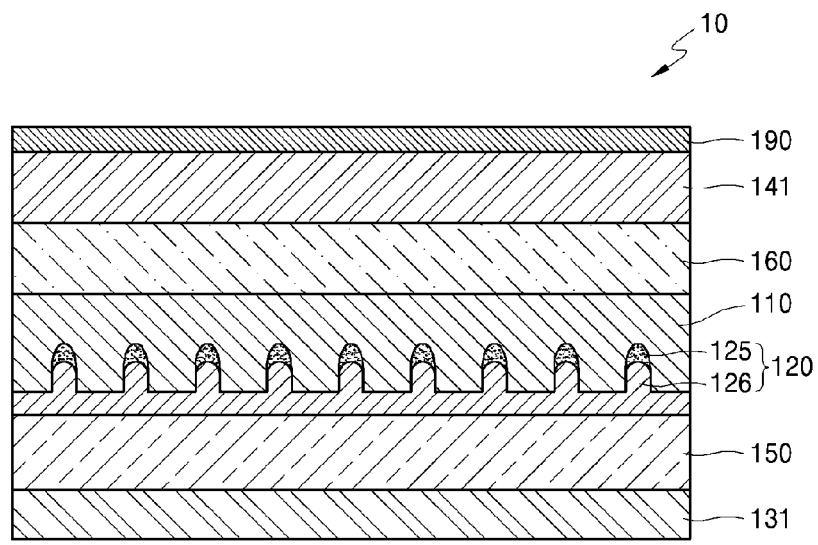
Figure 17:
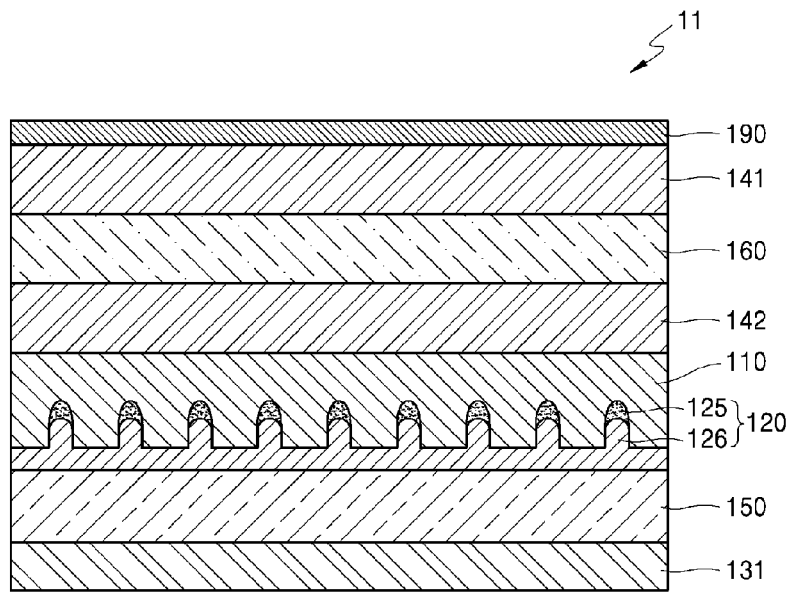

Referring to FIGS. 16 and 17, an embodiment of the optical film 10 or 11 includes the first adhesive layer 131, the phase shift layer 150, the low refractive index pattern layer 120, the high refractive index pattern layer 110, the linear polarization layer 160, the first base film 141, and the anti-reflection film 190 that are sequentially disposed from the bottom.

In such an embodiment, as shown in FIG. 17, the optical film 11 may further include the second base film 142 disposed between the high refractive index pattern layer 110 and the linear polarization layer 160.

Figure 18:
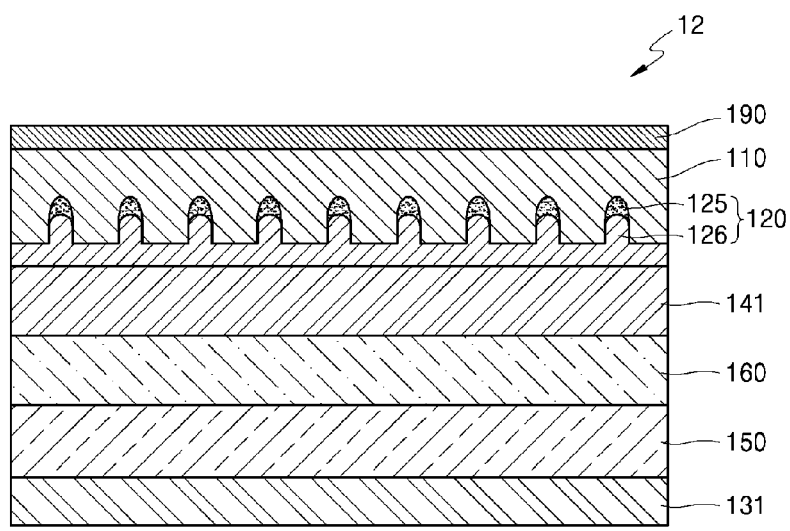

In such an embodiment, as shown in FIG. 18, the optical film 12 may include the first adhesive layer 131, the phase shift layer 150, the linear polarization layer 160, the first base film 141, the low refractive index pattern layer 120, the high refractive index pattern layer 110 and the anti-reflection film 190 that are sequentially disposed from the bottom, e.g., sequentially stacked on one another.

FIGS. 19 through 22 are cross-sectional views illustrating structures of embodiments of an optical film, each including a transmittance-adjusting layer, according to the invention.

In an embodiment, the optical film may include a transmittance-adjusting layer 170, which may be a film formed by dispersing, in a polymer resin, a black material for absorbing light such as a black dye, a pigment, carbon black, or cross-linked particles on which a black dye, a pigment, or carbon black is coated. In one embodiment, for example, the polymer resin may include, but are not limited to, a binder such as polymethyl methacrylate ("PMMA") and a UV-curable resin such as an acryl-based resin. In such an embodiment, a proportion of the black material contained in the polymer resin or a thickness of the transmittance-adjusting layer 170 may be predetermined based on optical properties of the black material. In such an embodiment, a transmittance of the transmittance-adjusting layer 170 may be equal to or greater than about 40%, which is slightly higher than a transmittance of the circular polarization film. Although the circular polarization film may completely block external light, a transmittance of the optical film may be thereby decreased. In an embodiment, where the optical film includes the transmittance-adjusting layer 170, a transmittance of the optical film may be effective prevented from being substantially lowered.

Figure 19:
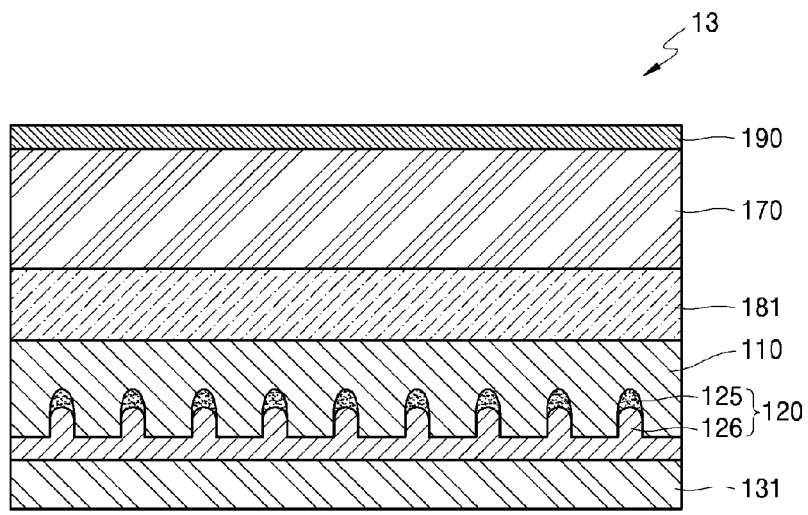
FIGS. 19 through 22 are cross-sectional views illustrating structures of embodiments of an optical film, each including a transmittance-adjusting layer.
Figure 20:
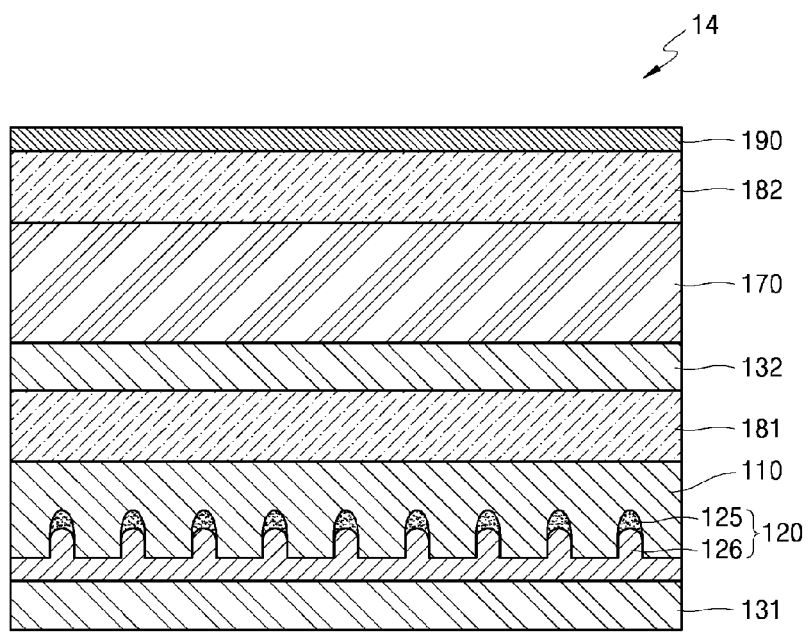

Referring to FIGS. 19 and 20, an embodiment of the optical film 13 or 14 includes the first adhesive layer 131, the low refractive index pattern layer 120, the high refractive index pattern layer 110, a first carrier film 181 and the anti-reflection film 190 that are sequentially disposed from the bottom or sequentially stacked on one another.

In an embodiment, as shown in FIG. 20, the optical film 14 includes the second adhesive layer 132 disposed between the first carrier film 181 and the transmittance-adjusting layer 170, and a second carrier film 182 disposed between the transmittance-adjusting layer 170 and the anti-reflection film 190.

Figure 21:
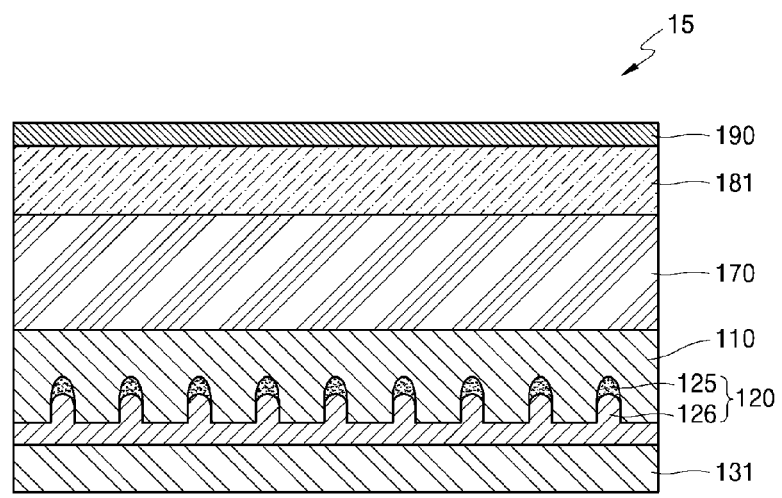
Figure 22:
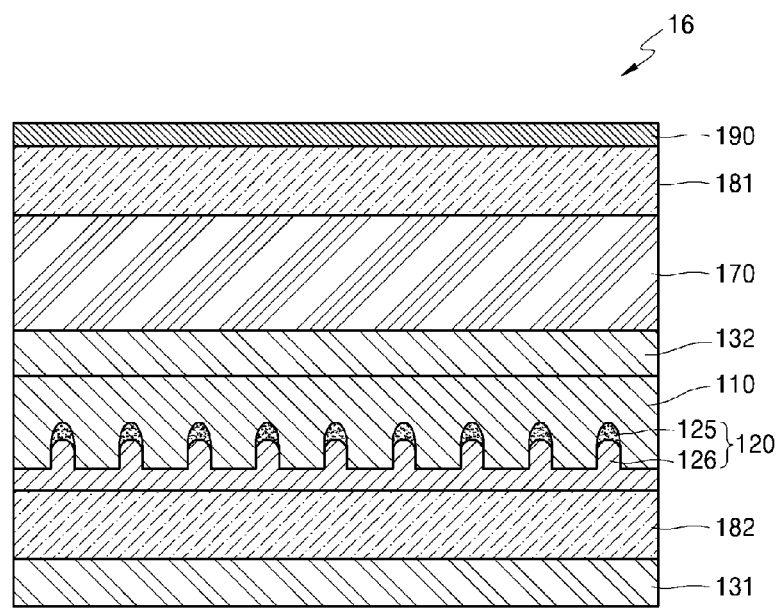

In an embodiment, as shown in FIGS. 21 and 22, the optical film 15 or 16 includes the first adhesive layer 131, the low refractive index pattern layer 120, the high refractive index pattern layer 110, the transmittance-adjusting layer 170, the first carrier film 181 and the anti-reflection film 190 that are sequentially disposed from the bottom.

In such an embodiment, as shown in FIG. 22, the optical film 16 may further include the second adhesive layer 132 disposed between the high refractive index pattern layer 110 and the transmittance-adjusting layer 170, and the second carrier film 182 disposed between the first adhesive layer 131 and the low refractive index pattern layer 120.

The first and second carrier films 181 and 182 may be used as substrates for forming the high refractive index pattern layer 110 and the low refractive index pattern layer 120, or as substrates for forming the anti-reflection film 190 or the transmittance-adjusting layer 170. In such an embodiment shown in FIGS. 19 through 21, since the optical film 13 through 16 does not include a linear polarization layer and thus may not maintain polarization, such an embodiment of the optical film shown in FIGS. 19 through 22 may use any of various materials including TAO, polyethylene terephthalate ("PET"), and PC.

In embodiments of the optical film 5 through 16 shown in FIGS. 11 through 22 include the high refractive index pattern layer 110 and the low refractive index pattern layer 120 having a shape thereof shown in FIG. 1, but not being limited thereto. In an alternative embodiment, the shape of the high refractive index pattern layer 110 and the low refractive index pattern layer 120 may be variously modified to have a different shape, e.g., the shapes thereof shown in FIGS. 6 through 9.

In embodiments of the invention, as described herein, the optical film refracts and emits light that is vertically incident and light that is obliquely incident in various directions including a front direction and a side direction. In such embodiments, a low refractive index pattern layer is disposed on a high refractive index pattern layer, and the low refractive index pattern layer has multiple refractive indices, such that adhesiveness between the high refractive index pattern layer and the low refractive index pattern layer is increased and reliability is improved.

In embodiments of the invention, as described herein, the optical film may be applied to an organic light-emitting display device. An embodiment of the organic light-emitting display device according to the invention may include an organic light-emitting layer that has a microcavity structure that increases color purity. In such an embodiment, a color shift with respect to a viewing angle may be reduced, thereby effectively displaying a high-quality image.

Figure 23:
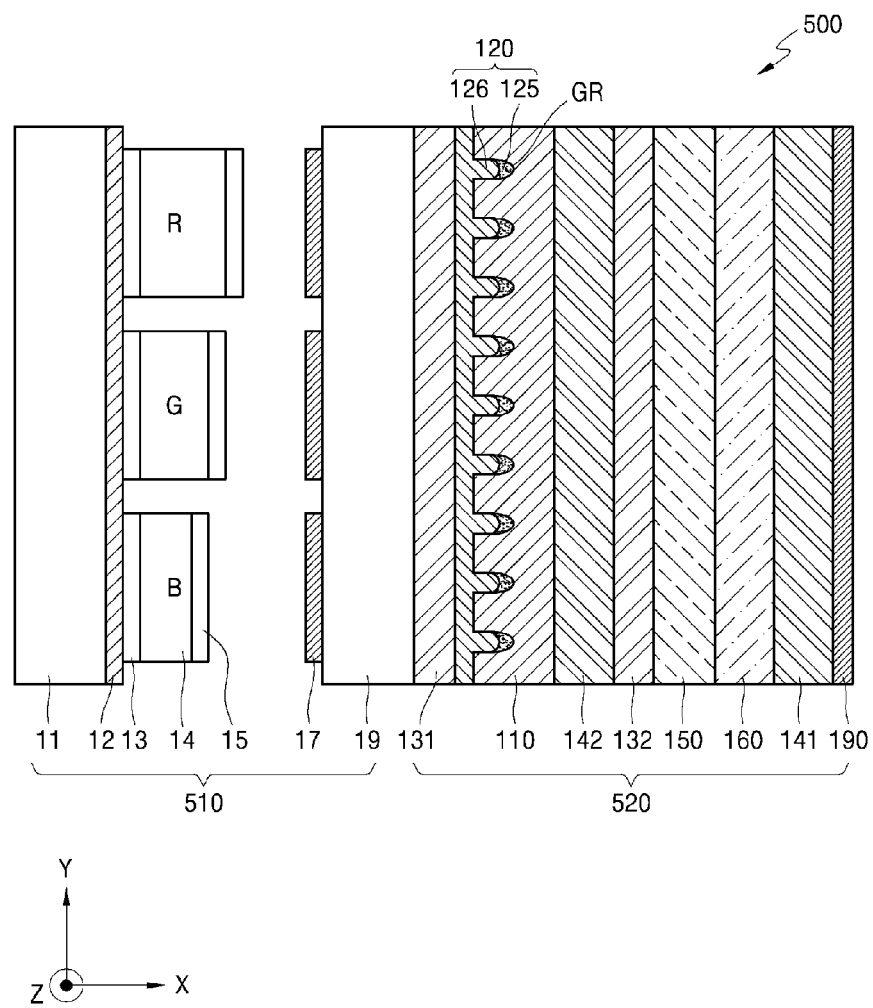
FIG. 23 is a cross-sectional view illustrating a structure of an embodiment of an organic light-emitting display device according to the invention.
Figure 24:
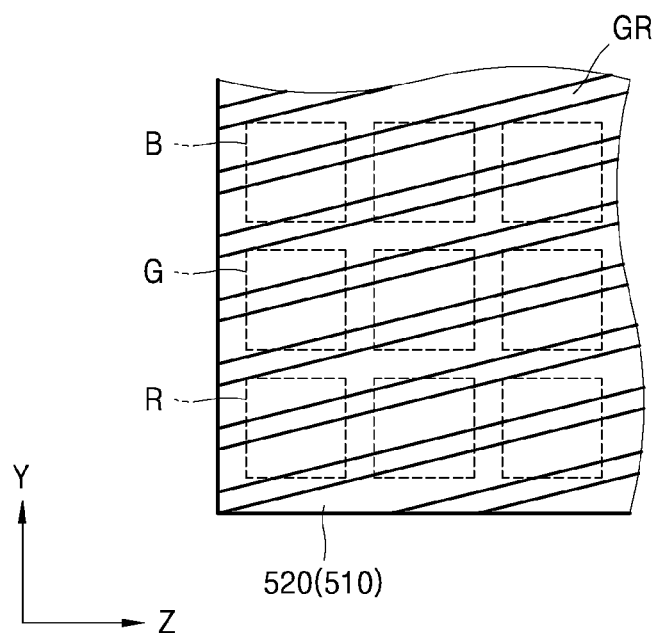
FIG. 24 is a view illustrating a positional relationship of an optical film and an arrangement of pixels in the organic light-emitting display device of FIG. 23.

FIG. 23 is a cross-sectional view illustrating a structure of an embodiment of an organic light-emitting display device 500 according to the invention. FIG. 24 is a view illustrating a positional relationship between an optical film 520 and an arrangement of pixels of an organic light-emitting display panel 510 in the organic light-emitting display device 500 of FIG. 23.

An embodiment of the organic light-emitting display device 500 includes the organic light-emitting panel 510 and the optical film 520 that is disposed on the organic light-emitting panel 510. In such an embodiment, the organic light-emitting panel 510 includes a plurality of pixels including organic light-emitting layers, each of which emits light of different wavelengths, and has a microcavity structure that resonates light of a corresponding wavelength.

In an embodiment, as shown in FIG. 23, the optical film 520 in the organic light-emitting display device 500 may be substantially the same as the optical film 7 shown in FIG. 13, but the invention is not limited thereto. In an alternative embodiment, the organic light-emitting display device 500 may include an optical film having a structure substantially the same as the structure of an embodiment of the optical film 1 to 16 described herein.

In an embodiment, the organic light-emitting panel 510 is configured to have a microcavity structure to increase luminance and color purity. In such an embodiment, the organic light-emitting panel 500 includes a plurality of OLEDs that emit red R, green G, blue B or white light, and each OLED includes an anode 13, an organic light-emitting layer 14, and a cathode 15. In an embodiment, as shown in FIG. 23, where the organic light-emitting panel 510 includes OLEDs whose unit pixels are configured to emit red R, green G and blue light B, the organic light-emitting panel 510 may have a microcavity structure where a distance between the anode 14 and the cathode 16 of the OLED that emits red R light having a relatively long wavelength is the longest, and a distance between the anode 14 and the cathode 16 of the OLED that emits blue B light having a relatively short wavelength is the shortest. In such an embodiment of the organic light-emitting panel 510, a distance between the anode 13 and the cathode 15 corresponds to a representative wavelength of each of red R, green G, and blue B light to resonate and emit only corresponding component of the light to the outside and weaken other components of the light.

A structure of an embodiment of the organic light-emitting panel 510 will now be described in greater detail.

Each sub-pixel of the organic light-emitting panel 510 may include an OLED that is disposed between first and second substrates 11 and 19, which face each other and include the anode 13, the organic light-emitting layer 14 and the cathode 15, and a driving circuit unit 12 that is disposed on the first substrate 11 and is electrically connected to the anode 13 and the cathode 15.

The anode 13 may include or be formed of an opaque metal such as aluminum (Al), and the cathode 15 may be a transparent electrode including, for example, indium tin oxide ("ITO"), or a semi-transparent electrode including, for example, nickel (Ni), such that light emitted from the organic light-emitting layer 14 may be effectively transmitted through the cathode 15.

The driving circuit unit 12 may include at least two thin-film transistors ("TFT"s) (not shown) and capacitors (not shown), and controls a brightness of the OLED by controlling an amount of current supplied to the OLED based on a data signal.

The driving circuit unit 12, which is a circuit for driving a unit pixel of the organic light-emitting panel 510, may include a gate line, a data line that substantially perpendicularly crosses the gate line, a switching TFT that is connected to the gate line and the data line, a driving TFT that is connected to the OLED between the switching TFT and a power line, and a storage capacitor that is connected between a gate electrode of the driving TFT and the power line.

In such an embodiment, the switching TFT applies a data signal of the data line to a gate electrode of the driving TFT and the storage capacitor in response to a scan signal of the gate line. The driving TFT controls a brightness of the OLED by adjusting current supplied to the OLED from the power line in response to a data signal from the switching TFT. In such an embodiment, the storage capacitor stores a data signal from the switching TFT and applies a stored voltage to the driving TFT, and thus the driving TFT allows a constant current to be supplied even when the switching TFT is turned off.

The organic light-emitting layer 14 includes a hole injection layer ("HIL"), a hole transport layer ("HTL"), a light-emitting layer, an electron transport layer ("ETL"), and an electron injection layer ("EIL") that are sequentially stacked on one another on the anode 13. In such an embodiment, when a forward voltage is applied between the anode 13 and the cathode 15, electrons move from the cathode 15 through the EIL and the ETL into the light-emitting layer, and holes move from the anode 13 through the HIL and the HTL into the light-emitting layer. The electrons and the holes injected into the light-emitting layer recombine in the light-emitting layer, to generate excitons, and light is emitted when the excitons change from an excited state to a ground state. In such an embodiment, a brightness of the emitted light is substantially proportional to the amount of current that flows between the anode 13 and the cathode 15.

In an embodiment, the organic light-emitting panel 510 includes a color filter 17 to improve color efficiency. In such an embodiment, the color filter 17 is disposed on the second substrate 19, and a red color filter is disposed in a red sub-pixel region, a green color filter is disposed in a green sub-pixel region, and a blue color filter is disposed in a blue sub-pixel region. In an embodiment, where the unit pixels have 4 colors (red, green, blue and white), the color filter 17 may be omitted in a white sub-pixel region.

In an embodiment, a black matrix (not shown) for effectively preventing light leakage and color mixture may be disposed at a boundary of each sub-pixel of the second substrate 19.

In an embodiment of the organic light-emitting display device 500 having a microcavity structure, a color shift occurs toward a short wavelength because as a viewing angle tilts from a front to a lateral side, maximum resonant wavelength moves to short wavelength. In one embodiment, for example, while white light may be observed at the front, a blue shift may occur at the lateral side, and thus light may become bluish.

In an embodiment, the organic light-emitting display device 500 includes the optical film 520 that is disposed on the organic light-emitting display panel 510 to reduce such a color shift.

In an embodiment, each of the grooves GR of the optical film 520 may extend in a predetermined direction to be in a stripe shape, and in such an embodiment, the optical film 520 may be disposed on the organic light-emitting panel 510 such that a extending direction of the stripe shape corresponds to a vertical direction Z of the organic light-emitting panel 510. In an embodiment, the optical film 520 may be disposed on the organic light-emitting panel 510 such that a predetermined number of grooves of the grooves GR correspond to one pixel of the organic light-emitting panel 510.

In an embodiment, as described with reference to FIGS. 2 and 3, the high refractive index pattern layer 110 and the low refractive index pattern layer 120 function as a color shift-reducing layer by allowing light that is incident at a constant angle to be emitted at various angles. The light emitted from the organic light-emitting display panel 510 has a predetermined angle distribution at which light is emitted and has a color shift that varies with respect to the angle. After passing through the color shift-reducing layer including the high refractive index pattern layer 110 and the low refractive index pattern layer 120, light that is incident on the color shift-reducing layer at an angle that causes a large color shift and light that is incident on the color shift-reducing layer at an angle that causes a small color shift are uniformly mixed and emitted, thereby reducing a color shift with respect to viewing angle of a viewer.

As shown in FIG. 24, a plurality of pixels, e.g., red R, greed G and blue B pixels, of the organic light-emitting panel 510 may be arranged substantially in a matrix form, e.g., two-dimensionally arranged in a horizontal direction Y and the vertical direction Z of the organic light-emitting panel 510, and the extending direction of the stripe shape of each of the grooves GR of the optical film 520 and the vertical direction Z, in which the plurality of pixels R, G, and B are arranged, may not be parallel to each other, that is, form an angle greater than zero (0). When each of the grooves GR has a stripe shape, a Moiré pattern may be formed due to interference between the organic light-emitting panel 510 and the optical film 520. In an embodiment, a predetermined angle is formed between the extending direction of the stripe shape and the vertical direction Z in which the plurality of pixels R, G, and B are arranged, as shown in FIG. 24, such that the Moiré pattern may be effectively prevented from being formed.

In an embodiment, where the optical film 520 is disposed to reduce a color shift with respect to a viewing angle, an image distortion may occur due to the optical film 520. Accordingly, in such an embodiment, a distance between the organic light-emitting layer 14 and the optical film 520 may be equal to or less than about 1.5 millimeters (mm) to minimize such image distortion.

While one or more embodiments of the invention have been described with reference to the figures, it will be understood by those of ordinary skill in the art that various changes in form and details may be made therein without departing from the spirit and scope of the invention as defined by the following claims. Accordingly, the true technical scope of the invention is defined by the technical spirit of the appended claims.

What is claimed is:

1. An optical film comprising:
a high refractive index pattern layer comprising a material having a refractive index greater than 1 and having a first surface and a second surface, which face each other, wherein a plurality of grooves is defined in the first surface of the high refractive index pattern; and
a low refractive index pattern layer comprising a plurality of protruding patterns disposed in the plurality of grooves of the high refractive index pattern, having a refractive index less than the refractive index of the high refractive index pattern layer, and comprising a plurality of layers having different refractive indices from each other, wherein each of the different refractive indices are less than the refractive index of the high refractive index pattern layer.

2. The optical film of claim 1, wherein the low refractive index pattern layer comprises:
a first layer disposed on bottom surfaces of the plurality of grooves and having a thickness less than the depth of each of the plurality of grooves; and
a second layer disposed on the first layer and comprising a material having a refractive index less than a refractive index of the first layer.

3. The optical film of claim 2, wherein the low refractive index pattern layer further comprises:
an intermediate layer disposed between the first layer and the second layer and comprising a material having a refractive index less than the refractive index of the first layer and greater than the refractive index of the second layer.

4. The optical film of claim 2, wherein the first layer and a portion of the second layer collectively define the plurality of protruding patterns which corresponds to the plurality of grooves, respectively.

5. The optical film of claim 4, wherein the second layer further comprises a flat portion having a predetermined thickness and which connects the plurality of protruding patterns.

6. The optical film of claim 1, wherein the low refractive index pattern layer comprises a resin material.

7. The optical film of claim 6, wherein the low refractive index pattern layer comprises a transparent resin material comprising a light diffuser or a light absorber.

8. The optical film of claim 1, wherein each of the plurality of grooves has a stripe shape.

9. The optical film of claim 1, wherein each of the plurality of grooves has a dot shape.

10. The optical film of claim 1, further comprising:
an anti-reflection film disposed over the high refractive index pattern layer.

11. The optical film of claim 10, further comprising:
a circular polarization film disposed between the high refractive index pattern layer and the anti-reflection film, wherein the circular polarization film comprises a phase shift layer and a linear polarization layer.

12. The optical film of claim 10, further comprising:
a transmittance-adjusting layer disposed between the high refractive index pattern layer and the anti-reflection film.

13. An organic light-emitting display device comprising:
an organic light-emitting panel comprising a plurality of pixels and having a microcavity structure which resonates light having a corresponding wavelength, wherein the plurality of pixels comprises a plurality of organic light-emitting layers, each of which emits light of different wavelengths; and
an optical film disposed on the organic light-emitting panel, wherein the optical film comprises:
a high refractive index pattern layer comprising a material having a refractive index greater than 1 and having a first surface and a second surface, which face each other, wherein a plurality of grooves is defined in the first surface of the high refractive index pattern; and
a low refractive index pattern layer comprising a plurality of protruding patterns disposed in the plurality of grooves of the high refractive index pattern, having a refractive index less than the refractive index of the high refractive index pattern layer, and comprising a plurality of layers having different refractive indices from each other, wherein each of the different refractive indices are less than the refractive index of the high refractive index pattern layer.

14. The organic light-emitting display device of claim 13, wherein each of the plurality of grooves has a stripe shape.

15. The organic light-emitting display device of claim 14, wherein
the plurality of pixels are two-dimensionally arranged in vertical and horizontal directions on the organic light-emitting panel,
wherein an extending direction of the stripe shape forms an angle greater than zero with the vertical direction of the plurality of pixels.

\* \* \* \* \*